United States Patent
Lee et al.

(10) Patent No.: US 8,014,215 B2
(45) Date of Patent: Sep. 6, 2011

(54) CACHE ARRAY POWER SAVINGS THROUGH A DESIGN STRUCTURE FOR VALID BIT DETECTION

(75) Inventors: Michael J. Lee, Austin, TX (US); Bao G. Truong, Austin, TX (US); Samuel I. Ward, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/635,234

(22) Filed: Dec. 10, 2009

(65) Prior Publication Data

US 2011/0141826 A1    Jun. 16, 2011

(51) Int. Cl.
    *G11C 7/00*    (2006.01)
(52) U.S. Cl. ............ 365/189.08; 365/49.1; 365/49.17; 365/230.06
(58) Field of Classification Search ............ 365/49.17; 711/131
    See application file for complete search history.

(56) References Cited

U.S. PATENT DOCUMENTS

| | | | |
|---|---|---|---|
| 5,963,718 A | 10/1999 | Muramatsu | |
| 6,016,534 A | 1/2000 | Kumar et al. | |
| 6,021,461 A * | 2/2000 | Dhong et al. | 711/105 |
| 6,157,986 A | 12/2000 | Witt | |
| 6,198,684 B1 * | 3/2001 | Zhang et al. | 365/230.06 |
| 6,510,506 B2 | 1/2003 | Nagapudi et al. | |
| 7,240,277 B2 | 7/2007 | Anderson et al. | |
| 2008/0259667 A1 | 10/2008 | Wickeraad | |
| 2009/0244992 A1 | 10/2009 | Goetz | |

OTHER PUBLICATIONS

Aggarwal, Aneesh, "Reducing Latencies of Pipelined Cache Accesses Through Set Prediction", ACM Digital Library, 2005, 11 pages.
Chaver, Daniel et al., "Branch Prediction On Demand: Energy-Efficient Solution", ACM Digital Library, 2003, pp. 390-395.
International Search Report and Written Opinion dated Mar. 24, 2011 for International Application No. PCT/EP2010/067524, 9 pages.

* cited by examiner

*Primary Examiner* — Tan T. Nguyen
(74) *Attorney, Agent, or Firm* — Francis Lammes; Stephen J. Walder, Jr.; Matthew B. Talpis (57) ABSTRACT

A mechanism is provided for gating a read access of any row in a cache access memory that has been invalidated. An address decoder in the cache access memory sends a memory access to a non-gated wordline driver and a gated wordline driver associated with the memory access. The non-gated wordline driver outputs the data stored in a valid bit memory cell to the gated wordline driver in response to the non-gated wordline driver determining the memory access as a read access. The gated wordline driver determines whether the data from the valid bit memory cell from the non-gated wordline driver indicates either valid data or invalid data in response to the gated wordline driver determining the memory access as a read access and denies an output of the data in a row of memory cells associated with the gated wordline driver in response to the data being invalid.

24 Claims, 7 Drawing Sheets

FIG. 9

CACHE ARRAY POWER SAVINGS THROUGH A DESIGN STRUCTURE FOR VALID BIT DETECTION

BACKGROUND

The present application relates generally a design structure, and more specifically to a design structure for saving cache array power through valid bit detection.

Random access memory (RAM) most commonly refers to computer chips that temporarily store dynamic data to enhance computer performance. By storing frequently used or active files in random access memory, a computer may access the data faster than if the computer retrieves the data from a far-larger hard drive. Random access memory is volatile memory, meaning it loses its contents once power is cut. This is different from non-volatile memory such as hard disks and flash memory, which do not require a power source to retain data. When a computer shuts down properly, data located in random access memory is committed to permanent storage on the hard drive or flash drive. At the next boot-up, RAM begins to fill with programs automatically loaded at startup and with files opened by the user.

Random access memory, which may also be referred to as cache memory arrays, is comprised of a plurality of memory cells having an individual logic circuit associated with each memory cell. Cache memory arrays may also employ the concept of a valid bit. Each logical row of memory cells contains at least one bit used to indicate whether the data stored is valid or invalid. Traditionally, the lookup would occur regardless of the state of the valid bit. Additional logic after the memory array output would discard the data returned from a read operation if the value stored for the valid bit denoted invalid data. The memory cell used to store data in an invalid bit may be different than traditional cells, such as the 6T cell. This difference consists of a reset port that may switch the state of the cell without the need for a standard wordline driver enabled access.

SUMMARY

In one illustrative embodiment, a method, in a cache access memory, is provided for gating a read access of any row in the cache access memory that has been invalidated. The illustrative embodiment sends, by an address decoder in the cache access memory, a memory access to a non-gated wordline driver and a gated wordline driver associated with the memory access. The illustrative embodiment determines, by the non-gated wordline driver, whether the memory access is a write access or a read access. Responsive to the non-gated wordline driver determining the memory access as being the read access, the illustrative embodiment outputs, by the non-gated wordline driver, the data stored in a valid bit memory cell to the gated wordline driver. The illustrative embodiment determines, by the gated wordline driver, whether the memory access is the write access or the read access. Responsive to the gated wordline driver determining the memory access as being the read access, the illustrative embodiment determines, by the gated wordline driver, whether the data from the valid bit memory cell from the non-gated wordline driver indicates either valid data or invalid data. Responsive to the data being invalid, the illustrative embodiment denies, by the gated wordline driver, an output of the data in a row of memory cells associated with the gated wordline driver.

In yet another illustrative embodiment, a cache access memory is provided. The cache access memory may comprise an address decoder in the cache access memory that sends a memory access to a non-gated wordline driver and a gated wordline driver associated with the memory access. The non-gated wordline driver determines whether the memory access is a write access or a read access and outputs the data stored in a valid bit memory cell to the gated wordline driver in response to the non-gated wordline driver determining the memory access as being the read access. The gated wordline driver determines whether the memory access is the write access or the read access, determines whether the data from the valid bit memory cell from the non-gated wordline driver indicates either valid data or invalid data in response to the gated wordline driver determining the memory access as being the read access, and denies an output of the data in a row of memory cells associated with the gated wordline driver in response to the data being invalid.

In another illustrative embodiment, a design structure embodied in a machine readable medium for designing, manufacturing, or testing an integrated circuit is provided. The design structure may be encoded on a machine-readable data storage medium and may comprise elements that, when processed in a computer-aided design system, generates a machine-executable representation of a booth decoder. The design structure may be a hardware description language (HDL) design structure. The design structure may comprise a netlist and may reside on a storage medium as a data format used for the exchange of layout data of integrated circuits.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for gating the read access of any row in a cache access memory (for example, a SRAM based cache memory) array that has been invalidated. When a read access to an invalid row is requested, that row's wordline driver would not fire. The bitlines would both stay at the precharge voltage and very little bitline power would be dissipated. The actual value stored in valid bit position would still need to propagate to the output of the array, since the downstream logic would need the valid bit data to ignore data returned from an array access of an invalid row.

Figure 1:
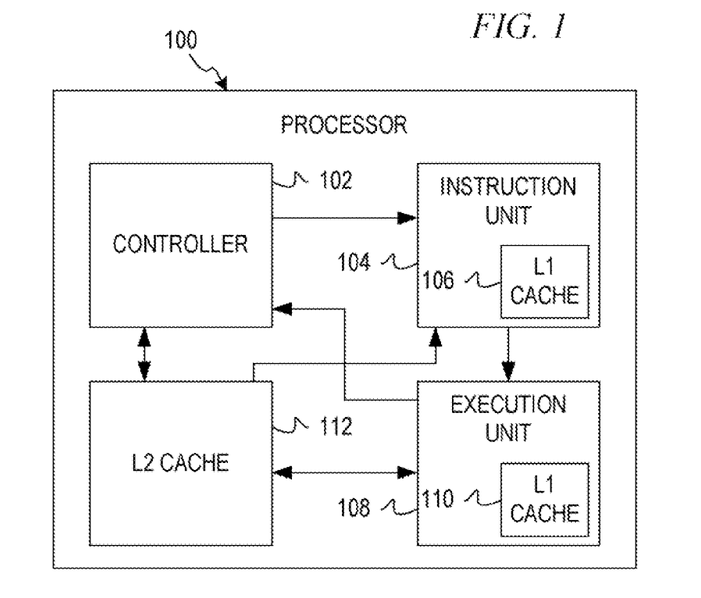
FIG. 1 is an exemplary block diagram of a processor in accordance with an illustrative embodiment.

FIG. 1 is provided as one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

Figure 2:
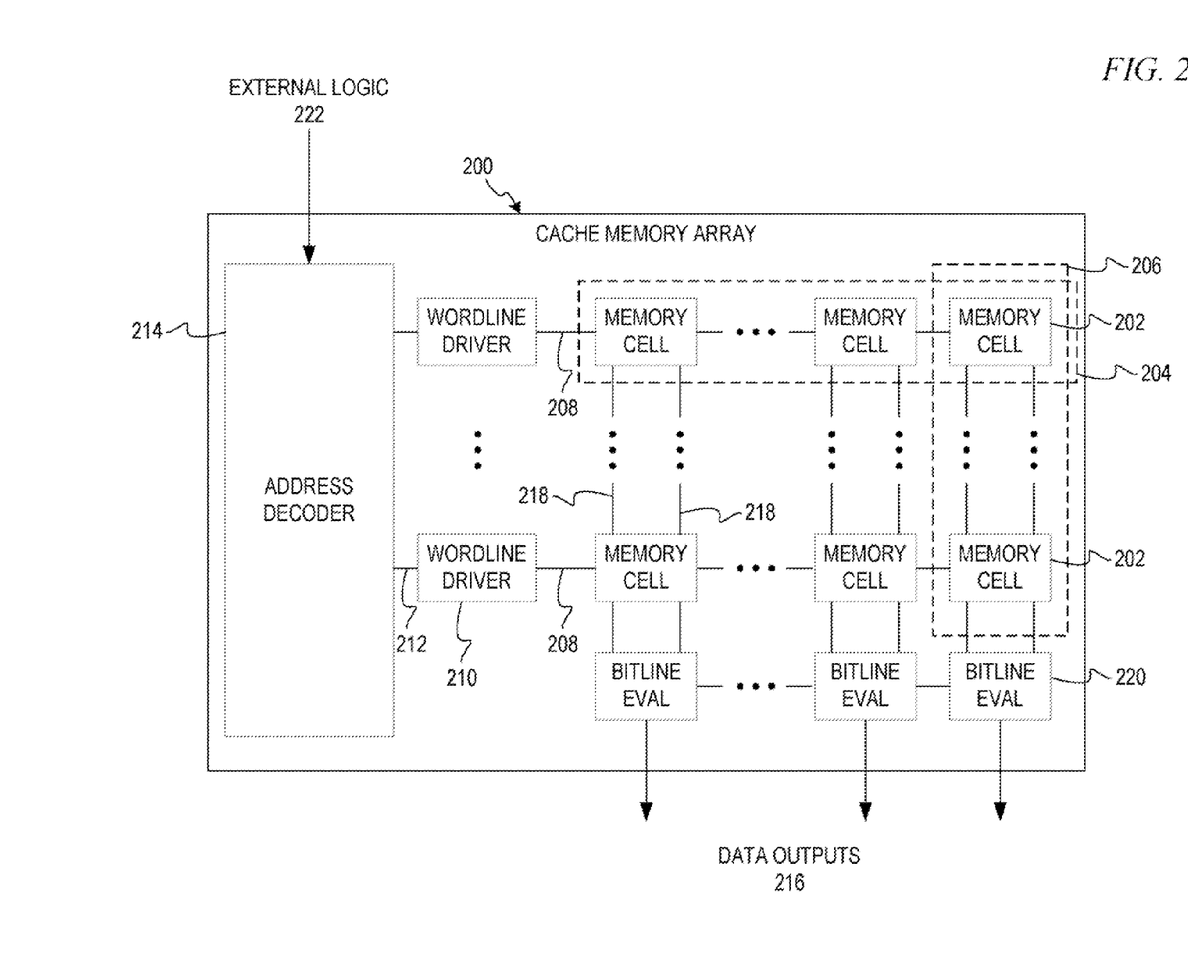
FIG. 2 illustrates a high-level example of a typical cache memory array comprising multiple memory cells in accordance with an illustrative embodiment.

FIG. 2 illustrates a high-level example of a typical cache memory array 200 comprising multiple memory cells 202 in accordance with an illustrative embodiment. Memory cells 202 are arranged as an array having rows 204 and columns 206. Memory cells 202 in a particular row 204 are connected to one another by wordlines 208. Wordlines 208 of each row 204 are also connected to wordline drivers 210 which receive output 212 from address decoder 214 that identifies which row 204 is to be output and cache memory array 200 outputs the corresponding data entry through data outputs 216. Memory cells 202 in a particular column 206 are connected to one another by a pair of bitlines 218 which are driven to complementary during read/write executions and are traditionally precharged to the voltage supply. The true and complement bitlines 218 feed bitline evaluators 220, which may be sense amplifiers, to convert the differential signal to a single-ended signal for use in logic downstream.

In operation, address decoder 214 receives an address associated with a read/write access from external logic 222. Address decoder 214 decodes the address and signals the particular one of wordline drivers 210 associated with the decoded address using output 212. The particular one of wordline drivers 210 then fires due to the signal from address decoder 214 and the data in the associated row 204 of memory cells 202 is output through data outputs 216 if the access is a read access or, if the access is a write access, data is written to memory cells 202 in associated row 204.

Figure 3:
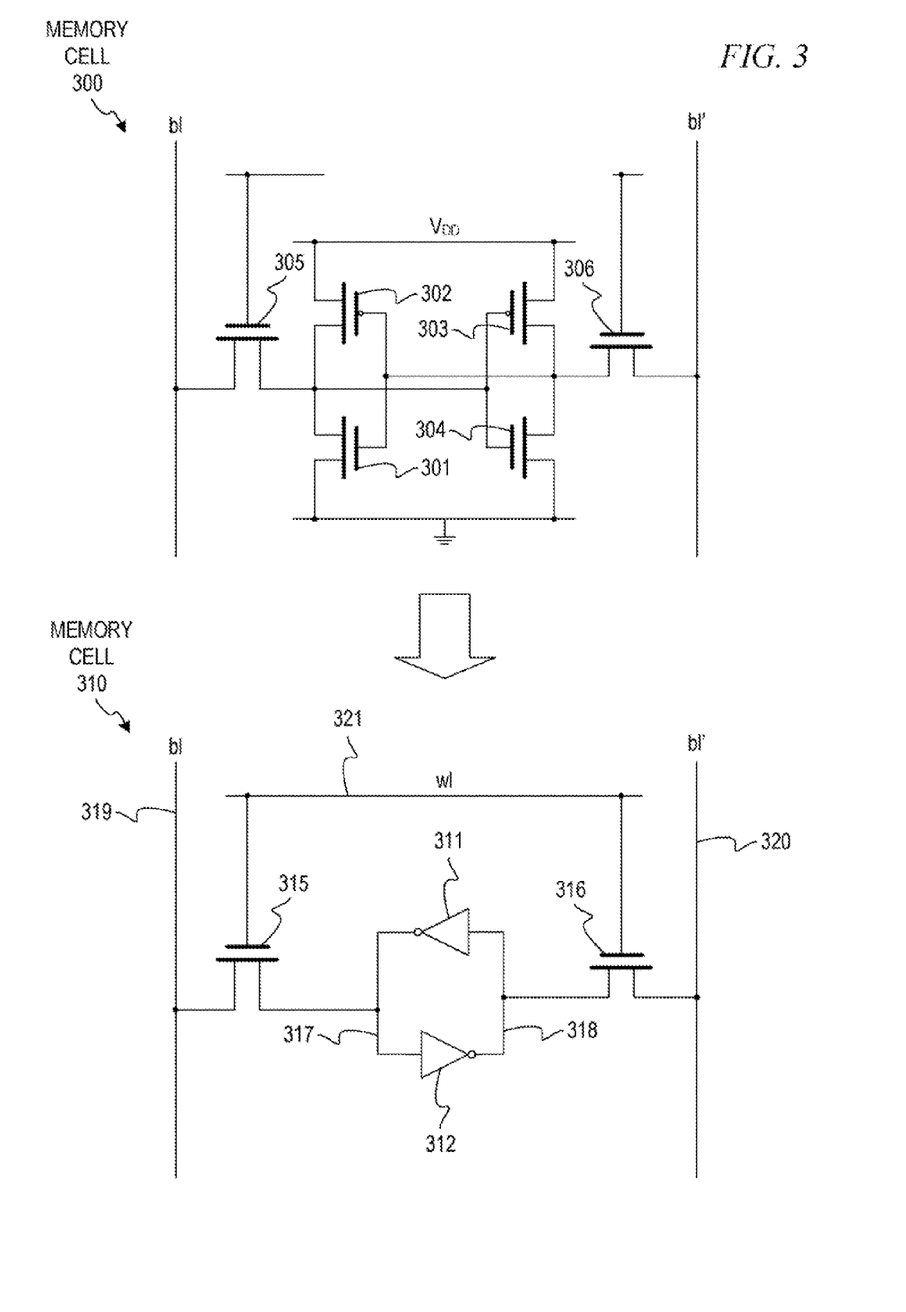
FIG. 3 depicts an example of a typical memory cell in accordance with an illustrative embodiment.

FIG. 3 depicts an example of a typical memory cell, such as one of memory cells 202 of FIG. 2, in accordance with an illustrative embodiment. Memory cell 300 forms the basis for most static random-access memories in CMOS technology. Memory cell 300 uses six transistors 301-306 to store and access one bit. Transistors 301-304 in the center form two cross-coupled inverters, which is illustrated in the more simplified memory cell 310 comprising inverters 311 and 312. Due to the feedback structure created by inverters 311 and 312, a low input value on inverter 311 will generate a high value on inverter 312, which amplifies (and stores) the low value on inverter 312. Similarly, a high input value on inverter 311 will generate a low input value on inverter 312, which feeds back the low input value onto inverter 311. Therefore, inverters 311 and 312 will store their current logical value, whatever value that is.

Lines 317 and 318 between inverters 311 and 312 are connected to separate bitlines 319 and 320 via two n-channel pass-transistors 315 and 316. The gates of transistors 315 and 316 are driven by wordline 321. In a memory array, such as memory array 200 of FIG. 2, wordline 321 is used to address and enable all bits of one memory word. As long as wordline 321 is kept low, memory cell 310 is disconnected from bitlines 319 and 320. Inverters 311 and 312 keep feeding themselves and memory cell 310 stores its current value.

When wordline 321 is high, both transistors 315 and 316 are conducting and connect the inputs and outputs of inverters 311 and 312 to bitlines 319 and 320. That is, inverters 311 and 312 drive the current data value stored inside the memory cell 310 onto bitline 319 and the inverted data value on inverted bitline 320. This data may then be amplified by a bitline evaluator, such as bitline evaluators 220 of FIG. 2, and generates the output value of memory cell 310 during a read operation. To write new data into memory cell 310, wordline 321 is activated and, depending on the current value stored inside memory cell 310, there might be a short-circuit condition and the value inside memory cell 310 is literally overwritten. This only works because transistors 301-304 that make up inverters 311 and 312 are very weak. That is, transistors 301-304 are considered weak because when new data is to be written to transistors 301-304, the current state of transistors 301-304 may be easily overridden with the new state.

The majority of the power dissipated in cache memory arrays comes from the precharging and discharging of bitlines during a read access. The bitlines, such as bitlines 218 in FIG. 2 and bitlines 319 and 320 in FIG. 3 must span the entire height of the cache memory array and tend to be highly capacitive. Since power is directly proportional to capacitance, lower power consumption results if the cache memory array bitlines are precharged and discharged less often. Known methods to save power array rely on reducing supply voltages to induce a "sleep" mode or decreasing bitline swing.

The illustrative embodiments gate the read access of any row in a cache memory array that has been invalidated. When a read access to an invalid row is requested, that row's wordline driver does not fire. The bitlines both stay at the precharge voltage and very little bitline power is dissapated. The illustrative embodiments implement a valid bit through the addition of memory cell per row. Programming the valid bit requires a firing of the wordline driver as with any write operation. However, the actual writing of the valid bit is then gated by a dedicated write enable signal. If this dedicated write enable signal is not asserted when the wordline fires, no data is driven to the valid bit and the contents of the valid bit cell is driven to the bitlines and a read occurs. Having this valid bit write enable signal allows external logic to invalidate any row in the cache memory array. The downstream logic would need the valid bit data to ignore data returned from an array access of an invalid row.

Figure 4:
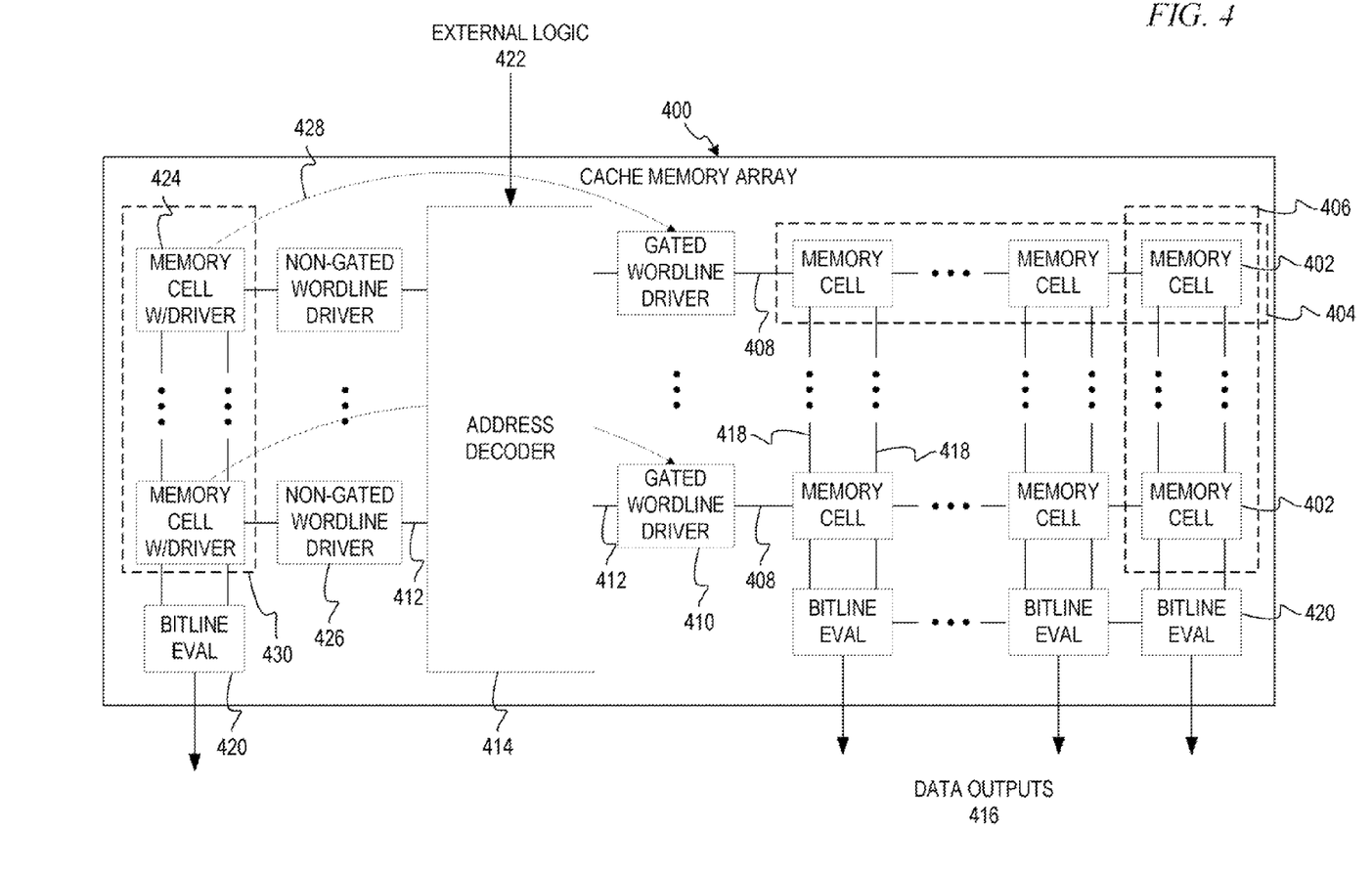
FIG. 4 illustrates one example of a cache memory array comprising multiple memory cells and valid bit memory cells in accordance with an illustrative embodiment.

FIG. 4 illustrates one example of a cache memory array 400 comprising multiple memory cells 402 and valid bit memory cells 424 in accordance with an illustrative embodiment. Memory cells 402 are arranged as an array having rows 404 and columns 406. Memory cells 402 in a particular row 404 are connected to one another by wordlines 408. Wordlines 408 of each row 404 are also connected to gated wordline drivers 410 which receive output 412 from address decoder 414 that identifies which row is to be output as well as output from an associated valid bit memory cell 424 that indicates whether the row as being valid or not. Memory cells 402 in a particular columns 406 as well as valid bit memory cells 424 in column 430 are connected to one another by a pair of bitlines 418 which are driven to complementary during read/write executions and are traditionally precharged to the voltage supply. The true and complement bitlines 418 feed bitline evaluators 420, which may be sense amplifiers, to convert the differential signal to a single-ended signal for use in logic downstream.

In operation, address decoder 414 receives an address associated with a read/write access from external logic 422. Address decoder 414 decodes the address and signals the particular one of non-gated wordline drivers 426 and gated wordline drivers 410 associated with the decoded address using outputs 412. The particular one of non-gated wordline drivers 426 then fires due to the signal from address decoder 414 and the valid bit in the associated valid bit memory cell 424 is output through data output 428 to the associated gated wordline drivers 410. if the data in data output 428 indicates that the data in the associated ones of memory cells 402 is valid, then the particular one of gated wordline drivers 410 fires due to the signal from address decoder 414 and the data in the associated row 404 of memory cells 402 is output through data outputs 416 if the access is a read access. In operation, if the access is a write access, data is written to memory cells 402 in associated row 404 regardless whether the data in data output 428 indicates that the data in the associated ones of memory cells 402 is valid or invalid.

Figure 5:
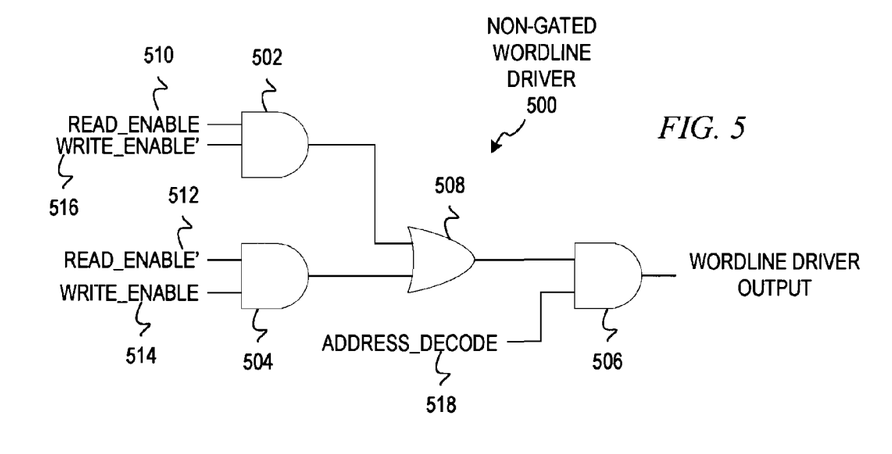
FIG. 5 depicts one exemplary implementation of a non-gated wordline driver in accordance with an illustrative embodiment.

FIG. 5 depicts one exemplary implementation of a non-gated wordline driver, such as non-gated wordline driver 426 of FIG. 4, in accordance with an illustrative embodiment. Non-gated wordline driver 500 comprises AND gates 502, 504, and 506 as well as OR gate 508. In operation, if an access received from an address decoder, such as address decoder 414 of FIG. 4, is a read access, then read_enable signal 510 is set high into AND gate 502 and the read access complement, read_enable' signal 512, is set low into AND gate 504. Since the access is a read access, write_enable signal 514 is set low into AND gate 504 and the write access complement, write_enable' 516 is set high into AND gate 502. Since read_enable signal 510 and write_enable' signal 516 are both high, AND gate 502 fires into OR gate 508. OR gate 508 then fires and with address_decode signal 518 from the address decoder, AND gate 506 fires and outputs a read access signal to the associated valid bit memory cell, such as valid bit memory cell 424 of FIG. 4. The valid bit memory cell then outputs an appropriate signal to an associated gated wordline driver, such as gated wordline driver 410 of FIG. 4. The signal from the valid bit memory cell would be high if the data is valid or low if the data is not valid.

In operation, if an access received from the address decoder is a write access, then read enable signal 510 is set low into AND gate 502 and the read access complement, read_enable' signal 512, is set high into AND gate 504. Since the access is a write access, write_enable signal 514 is set high into AND gate 504 and the write access complement, write_enable' 516 is set low into AND gate 502. Since write_enable signal 514 and read_enable' signal 512 arc both high, AND gate 504 fires into OR gate 508. OR gate 508 then fires and with address_decode signal 518 from the address decoder, AND gate 506 fires and outputs a write access signal to the associated valid bit memory cell. The valid bit memory cell then outputs an appropriate signal to an associated gated wordline driver, such as gated wordline driver 410 of FIG. 4.

Figure 6:
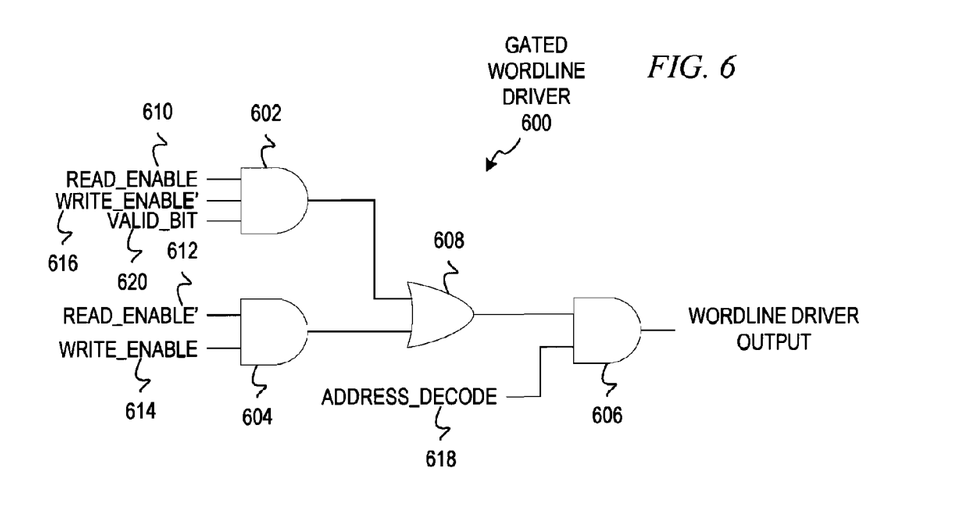
FIG. 6 depicts one exemplary implementation of a gated wordline driver in accordance with an illustrative embodiment.

FIG. 6 depicts one exemplary implementation of a gated wordline driver, such as gated wordline driver 410 of FIG. 4, in accordance with an illustrative embodiment. Gated wordline driver 600 comprises AND gates 602, 604, and 606 as well as OR gate 608. In operation, if an access received from an address decoder, such as address decoder 414 of FIG. 4, is a read access, then read_enable signal 610 is set high into AND gate 602 and the read access complement, read_enable' signal 612, is set low into AND gate 604. Since the access is a read access, write_enable signal 614 is set low into AND gate 604 and the write access complement, write_enable' 616 is set high into AND gate 602. Since read_enable signal 610 and write_enable' signal 616 are both high, then AND gate 602 looks to valid bit signal 620 from the valid bit memory cell to determine whether to fire or not. If valid bit signal 620 is low, then AND gate 602 does not fire and, conversely, if valid bit signal 620 is high then AND gate 602 fires into OR gate 608. OR gate 608 then fires and with address_decode signal 618 from the address decoder, AND gate 606 fires and outputs a read access signal to the associated memory cell, such as valid bit memory cell 402 of FIG. 4.

In operation, if an access received from the address decoder is a write access, then read_enable signal 610 is set low into AND gate 602 and the read access complement, read_enable' signal 612, is set high into AND gate 604. Since the access is a write access, write_enable signal 614 is set high into AND gate 604 and the write access complement, write_enable' 616 is set low into AND gate 602. Since write_enable signal 614 and read_enable' signal 612 are both high, AND gate 604 fires into OR gate 608. OR gate 608 then fires and with address_decode signal 618 from the address decoder, AND gate 606 fires and outputs a write access signal to the associated memory cell. As can be seen, regardless of valid bit signal 620 from the valid bit memory cell, a write access will always occur.

While the examples shown in FIGS. 5 and 6 comprise AND gates and OR gates and use high and low signals, one skilled in the art would realize that other gating mechanisms or combinations of gating mechanisms, such as NAND gates, NOR gates, inverters, or the like, may be used and make use of inverse signal to perform similar functions without departing from the spirit and scope of the invention.

Figure 7:
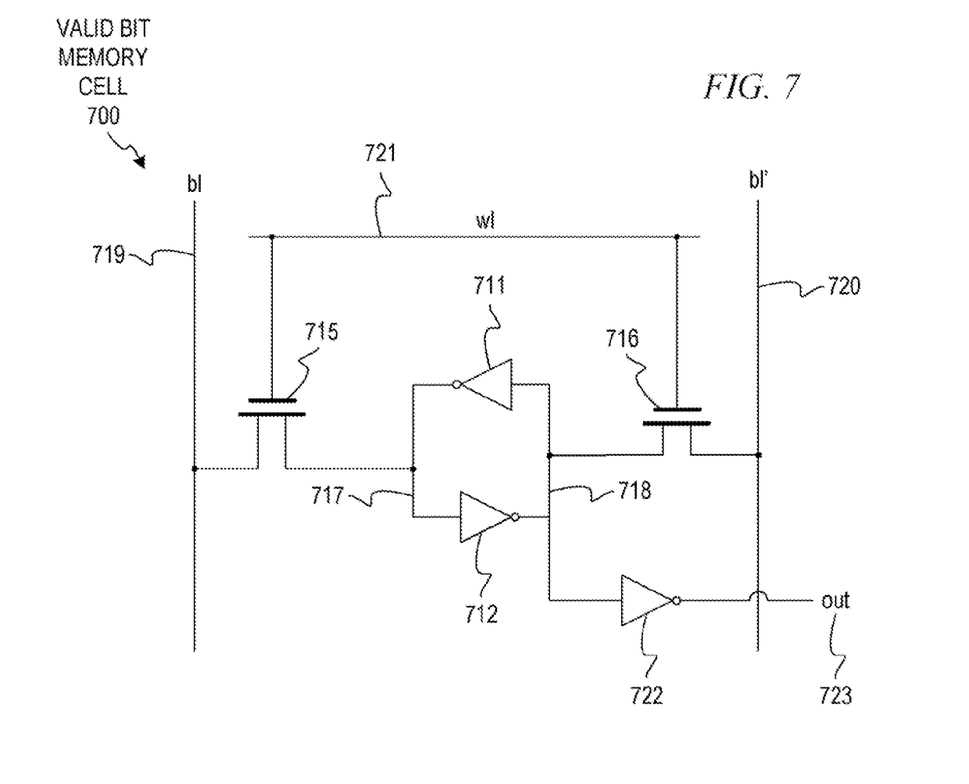
FIG. 7 depicts an example of a valid bit memory cell in accordance with an illustrative embodiment.

FIG. 7 depicts an example of a valid bit memory cell, such as valid bit memory cells 424 of FIG. 4, in accordance with an illustrative embodiment. Valid bit memory cell 700, which is similar to memory cell 310 of FIG. 3, may use six transistors to store and access one bit. As with memory cell 310 in FIG. 3, the four transistors in the middle form two cross-coupled inverters, which is illustrated in the more simplified valid bit memory cell 700 comprising inverters 711 and 712. Due to the feedback structure created by inverters 711 and 712, a low input value on inverter 711 will generate a high value on inverter 712, which amplifies (and stores) the low value on inverter 712. Similarly, a high input value on inverter 711 will generate a low input value on inverter 712, which feeds back the low input value onto inverter 711. Therefore, inverters 711 and 712 will store their current logical value, whatever value that is.

Lines 717 and 718 between inverters 711 and 712 are connected to separate bitlines 719 and 720 via two n-channel pass-transistors 715 and 716. The gates of transistors 715 and 716 are driven by wordline 721. In a memory array, such as memory array 200 of FIG. 2, wordline 721 is used to address and enable all bits of one memory word. As long as wordline 721 is kept low, valid bit memory cell 700 is disconnected from bitlines 719 and 720. Inverters 711 and 712 keep feeding themselves and valid bit memory cell 700 stores its current value.

When wordline 721 is high, both transistors 715 and 716 are conducting and connect the inputs and outputs of inverters 711 and 712 to bitlines 719 and 720. That is, inverters 711 and 712 drive the current data value stored inside valid bit memory cell 700 onto bitline 719 and the inverted data value on inverted bitline 720. This data may then be amplified by a bitline evaluator, such as bitline evaluators 420 of FIG. 4, and generates the output value of valid bit memory cell 700 during a read operation. To write new data into valid bit memory cell 700, wordline 721 is activated and, depending on the current value stored inside valid bit memory cell 700, there might be a short-circuit condition and the value inside valid bit memory cell 700 is literally overwritten. This only works because the transistors that, make up inverters 711 and 712 are very weak. That is, the transistors that make up inverters 711 and 712 are considered weak because when new data is to be written to the transistors, the current state of the transistors may be easily overridden with the new state.

In addition to the above, valid bit memory cell 700 also comprises inverter 722 that allows for the output of the value stored in inverters 711 and 712 to be output. This output is illustrated as output signal 723 and is the input to the gated wordline driver, such as gated wordline driver 410 of FIG. 4 as data output 428 and gated wordline driver 600 of FIG. 6 as valid bit signal 620.

Thus, the illustrative embodiments provide a mechanism to save power in memory arrays implemented with a valid bit. The power savings lie in gating off the read access to any row with invalid data. The invalid data condition prohibits the wordline driver from firing and thus stops any bitline from being discharged. No power is saved during a write operation since every bit (valid bit included) must be programmed to the incoming value.

The valid bit memory cell and the gated wordline driver circuitry of the illustrative embodiments, such as those described above with regard to FIGS. 4-7, is preferably implemented in an integrated circuit device. The valid bit memory cell and the gated wordline driver circuitry, for example, may be used in a processor for performing multiplication operations. It should be appreciated, however, that the circuitry described above may further be implemented as one or more software routines, in some illustrative embodiments, that approximate the operation of the circuits described above. Thus, not only may the illustrative embodiments be embodied in circuitry of a hardware device, such as an integrated circuit, processor, or the like, but they may also be implemented as software instructions executed by a processor.

Figure 8:
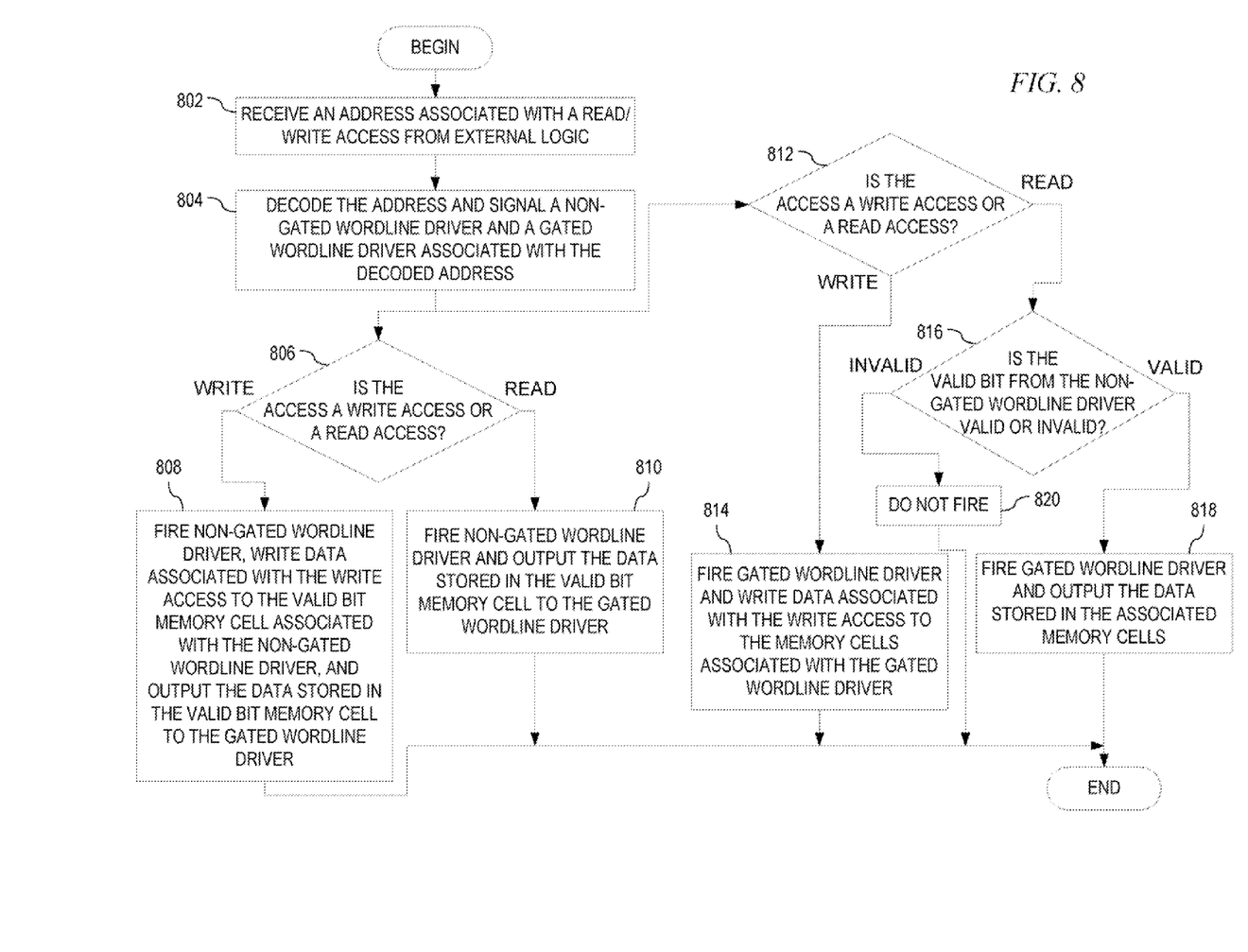
FIG. 8 is a flowchart outlining an exemplary operation of a cache memory array using a valid bit memory cell and the gated wordline driver in accordance with one illustrative embodiment.

FIG. 8 is a flowchart outlining an exemplary operation of a cache memory array using a valid bit memory cell and the gated wordline driver in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 8, the operation starts by an address decoder in a cache memory array receiving an address associated with a read/write access from external logic (step 802). The address decoder decodes the address and signals a non-gated wordline driver and a gated wordline driver associated with the decoded address (step 804). From this point the operation splits. The non-gated wordline driver determines whether the access associated with the decoded address is a write access or a read access (step 806). If at step 806 the non-gated wordline driver determines that the access is a write access, then the non-gated wordline driver fires, the data associated with the write access is written to the valid bit memory cell associated with the non-gated wordline driver, and the data stored in the valid bit memory cell is output to the gated wordline driver (step 808), with this part of the operation ending thereafter. If at step 806 the non-gated wordline driver determines that the access is a read access, then the non-gated wordline driver fires and the data stored in the valid bit memory cell is output to the gated wordline driver (step 810), with this part of the operation ending thereafter.

Also from step 804, the gated wordline driver determines whether the access associated with the decoded address is a write access or a read access (step 812). If at step 812 the gated wordline driver determines that the access is a write access, then the gated wordline driver fires and the data associated with the write access is written to the memory cells associated with the gated wordline driver (step 814), with this part of the operation ending thereafter. If at step 812 the gated wordline driver determines that the access is a read access, then the gated wordline driver determines whether the valid bit from the non-gated wordline driver is valid or invalid (step 816). If at step 816 the valid bit indicates that the data is valid, then the gated wordline driver fires and the data in the associated row of memory cells is output (step 818), with this part of the operation ending thereafter. If at step 816 the valid bit indicates that the data is invalid, then the gated wordline driver does not fire (step 820), with this part of the operation ending thereafter.

Thus, the illustrative embodiments provide a valid bit memory cell and gated wordline driver circuits that save power in memory arrays implemented with a valid bit. The power savings lies in gating off the read access to any row with invalid data. The invalid data condition prohibits the wordline driver from firing and thus stops any bitline from being discharged. No power is saved during a write operation since every bit (valid bit included) must be programmed to the incoming value.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 9:
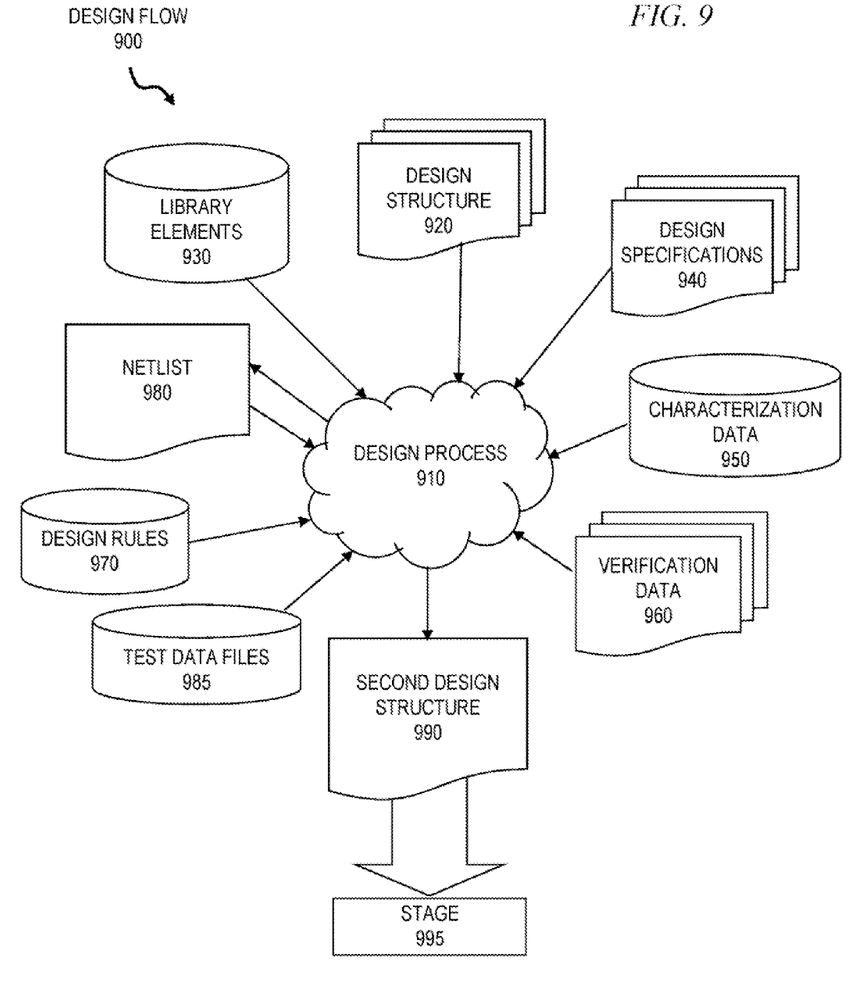
FIG. 9 is a flow diagram of a design process used in semiconductor design, manufacture, and/or test.

FIG. 9 shows a block diagram of an exemplary design flow 900 used, for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 4-7. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 5-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 5-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5-11. In one embodiment, design structure 990 may comprise a compiled, executable HDL simulation model that functionally simulates the devices shown in FIGS. 5-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 5-11. Design structure 990 may then proceed to a stage 995 where, for example, design structure 990 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a cache access memory, for gating a read access of any row in the cache access memory that has been invalidated, the method comprising:
   sending, by an address decoder in the cache access memory, a memory access to a non-gated wordline driver and a gated wordline driver associated with the memory access;
   determining, by the non-gated wordline driver, whether the memory access is a write access or a read access;
   responsive to the non-gated wordline driver determining the memory access as being the read access, outputting, by the non-gated wordline driver, the data stored in a valid bit memory cell to the gated wordline driver;
   determining, by the gated wordline driver, whether the memory access is the write access or the read access;
   responsive to the gated wordline driver determining the memory access as being the read access, determining, by the gated wordline driver, whether the data from the valid bit memory cell from the non-gated wordline driver indicates either valid data or invalid data; and
   responsive to the data being invalid, denying, by the gated wordline driver, an output of the data in a row of memory cells associated with the gated wordline driver.

2. The method of claim 1, further comprising:
   responsive to the data being valid, signaling, by the gated wordline driver, the row of memory cells associated with the gated wordline driver to output the data.

3. The method of claim 1, further comprising:
   responsive to the non-gated wordline driver determining the memory access as being the write access, writing, by the non-gated wordline driver, the data associated with the write access to the valid bit memory cell associated with the non-gated wordline driver;
   outputting, by the non-gated wordline driver, the data stored in the valid bit memory cell to the gated wordline driver; and
   responsive to the gated wordline driver determining the memory access as being the write access, writing, by the gated wordline driver, the data associated with the write access to the row of memory cells associated with the gated wordline driver.

4. The method of claim 1, wherein the non-gated wordline driver is one of a plurality of non-gated wordline drivers, wherein the gated wordline driver is one of a plurality of gated wordline drivers, and wherein the address decoder determines which non-gated wordline driver from the plurality of non-gated wordline drivers and which gated wordline driver from the plurality of gated wordline drivers to send the memory access to by:
   decoding, by the address decoder, an address associated with the memory access received from external logic.

5. The method of claim 1, wherein the non-gated wordline driver comprises:
   a first AND gate and a second AND gate, wherein the first AND gate has inputs of a read_enable signal and a write access complement signal, write_enable', and wherein the second AND gate has inputs of a read complement signal, read_enable', and a write_enable signal;
   an OR gate, wherein the OR gate receives an output from the first AND gate and an output from the second AND gate as inputs; and
   a third AND gate, that receives an output from the OR gate as a first input and an address_decode signal as a second input, wherein:
   responsive to receiving the write access:
      the read_enable signal is set low into the first AND gate, the read_enable' signal is set high into the second AND gate, the write_enable signal is set high into the second AND gate, and the write_enable' signal is set low into the first AND gate;
      responsive to the write enable signal and the read_enable' signal both being high, the second AND gate outputs to the OR gate and the OR gate outputs to the third AND gate; and
      responsive to receiving the output from the OR gate and with the address_decode signal, the third AND gate outputs a write access signal to the valid bit memory cell;
   responsive to receiving the read access:
      the read enable signal is set high into the first AND gate, the read_enable' signal is set low into the second AND gate, the write_enable signal is set low into the second AND gate, and the write_enable' signal is set high into first AND gate;

responsive to the read_enable signal and the write enable' signal both being high, the first AND gate outputs to the OR gate and the OR gate outputs to the third AND gate; and responsive to receiving the output from the OR gate and with the address_decode signal, the third AND gate outputs a read access signal to the valid bit memory cell.

6. The method of claim 1, wherein the gated wordline driver comprises:

a first AND gate and a second AND gate, wherein the first AND gate has inputs of a read_enable signal, a write access complement signal, write_enable', and a valid bit signal and wherein the second AND gate has inputs of a read complement signal, read_enable', and a write_enable signal;

an OR gate, wherein the OR gate receives an output from the first AND gate and an output from the second AND gate as inputs; and a third AND gate, that receives an output from the OR gate as a first input and an address_decode signal as a second input, wherein:

responsive to receiving the write access:

the read_enable signal is set low into the first AND gate, the read_enable' signal is set high into the second AND gate, the write_enable signal is set high into the second AND gate, and the write_enable' signal is set low into the first AND gate;

responsive to the write_enable signal and the read_enable' signal both being high, the second AND gate outputs to the OR gate and the OR gate outputs to the third AND gate; and responsive to receiving the output from the OR gate and with the address_decode signal, the third AND gate outputs a write access signal to the valid bit memory cell;

responsive to receiving the read access:

the read enable signal is set high into the first AND gate, the read_enable' signal is set low into the second AND gate, the write_enable signal is set low into the second AND gate, and the write_enable' signal is set high into first AND gate;

responsive to the read_enable signal and the write_enable' signal both being high and the valid bit signal being high, the first AND gate outputs to the OR gate and the OR gate outputs to the third AND gate;

responsive to receiving the output from the OR gate and with the address_decode signal, the third AND gate outputs a read access signal to the valid bit memory cell; and responsive to the read_enable signal and the write_enable' signal both being high and the valid bit signal being low, the first AND gate fails to output a signal to the OR gate thereby not allowing the read access to occur.

7. The method of claim 1, wherein the valid bit memory cell comprises:

memory cell logic coupled to inverter logic, wherein the inverter logic outputs a value stored in a first inverter and a second inverter in the memory cell logic to the gated wordline driver upon the memory access of the valid bit memory cell.

8. A cache access memory comprising:

an address decoder in the cache access memory for sending a memory access to a non-gated wordline driver and a gated wordline driver associated with the memory access;

the non-gated wordline driver for determining whether the memory access is a write access or a read access and for outputting the data stored in a valid bit memory cell to the gated wordline driver in response to the non-gated wordline driver determining the memory access as being the read access; and the gated wordline driver for determining whether the memory access is the write access or the read access, for determining whether the data from the valid bit memory cell from the non-gated wordline driver indicates either valid data or invalid data in response to the gated wordline driver determining the memory access as being the read access, and for denying an output of the data in a row of memory cells associated with the gated wordline driver in response to the data being invalid.

9. The cache access memory of claim 8, further comprising:

the gated wordline driver signaling the row of memory cells associated with the gated wordline driver to output the data in response to the data being valid.

10. The cache access memory of claim 8, further comprising:

the non-gated wordline driver writing the data associated with the write access to the valid bit memory cell associated with the non-gated wordline driver in response to the non-gated wordline driver determining the memory access as being the write access; and the non-gated wordline driver outputting the data stored in the valid bit memory cell to the gated wordline driver and writing the data associated with the write access to the row of memory cells associated with the gated wordline driver in response to the gated wordline driver determining the memory access as being the write access.

11. The cache access memory of claim 8, wherein the non-gated wordline driver is one of a plurality of non-gated wordline drivers, wherein the gated wordline driver is one of a plurality of gated wordline drivers, and wherein the address decoder determines which non-gated wordline driver from the plurality of non-gated wordline drivers and which gated wordline driver from the plurality of gated wordline drivers to send the memory access to by decoding an address associated with the memory access received from external logic.

12. The cache access memory of claim 8, wherein the non-gated wordline driver comprises:

a first AND gate and a second AND gate, wherein the first AND gate has inputs of a read_enable signal and a write access complement signal, write_enable', and wherein the second AND gate has inputs of a read complement signal, read_enable', and a write_enable signal;

an OR gate, wherein the OR gate receives an output from the first AND gate and an output from the second AND gate as inputs; and a third AND gate, that receives an output from the OR gate as a first input and an address_decode signal as a second input, wherein:

responsive to receiving the write access:

the read_enable signal is set low into the first AND gate, the read_enable' signal is set high into the second AND gate, the write_enable signal is set high into the second AND gate, and the write_enable' signal is set low into the first AND gate;

responsive to the write_enable signal and the read_enable' signal both being high, the second AND gate outputs to the OR gate and the OR gate outputs to the third AND gate; and responsive to receiving the output from the OR gate and with the address_decode signal, the third AND gate outputs a write access signal to the valid bit memory cell;

responsive to receiving the read access:
the read_enable signal is set high into the first AND gate, the read_enable' signal is set low into the second AND gate, the write_enable signal is set low into the second AND gate, and the write_enable' signal is set high into first AND gate;

responsive to the read_enable signal and the write_enable' signal both being high, the first AND gate outputs to the OR gate and the OR gate outputs to the third AND gate; and responsive to receiving the output from the OR gate and with the address_decode signal, the third AND gate outputs a read access signal to the valid bit memory cell.

13. The cache access memory of claim 8, wherein the gated wordline driver comprises:
a first AND gate and a second AND gate, wherein the first AND gate has inputs of a read_enable signal, a write access complement signal, write_enable', and a valid bit signal and wherein the second AND gate has inputs of a read complement signal, read_enable', and a write_enable signal;

an OR gate, wherein the OR gate receives an output from the first AND gate and an output from the second AND gate as inputs; and a third AND gate, that receives an output from the OR gate as a first input and an address_decode signal as a second input, wherein:

responsive to receiving the write access:
the read_enable signal is set low into the first AND gate, the read enable' signal is set high into the second AND gate, the write_enable signal is set high into the second AND gate, and the write_enable' signal is set low into the first AND gate;

responsive to the write_enable signal and the read_enable' signal both being high, the second AND gate outputs to the OR gate and the OR gate outputs to the third AND gate; and responsive to receiving the output from the OR gate and with the address_decode signal, the third AND gate outputs a write access signal to the valid hit memory cell;

responsive to receiving the read access:
the read_enable signal is set high into the first AND gate, the read_enable' signal is set low into the second AND gate, the write_enable signal is set low into the second AND gate, and the write_enable signal is set high into first AND gate;

responsive to the read_enable signal and the write_enable' signal both being high and the valid bit signal being high, the first AND gate outputs to the OR gate and the OR gate outputs to the third AND gate;

responsive to receiving the output from the OR gate and with the address_decode signal, the third AND gate outputs a read access signal to the valid bit memory cell; and responsive to the read_enable signal and the write_enable' signal both being high and the valid bit signal being low, the first AND gate fails to output a signal to the OR gate thereby not allowing the read access to occur.

14. The cache access memory of claim 8, wherein the valid bit memory cell comprises:
memory cell logic coupled to inverter logic, wherein the inverter logic outputs a value stored in a first inverter and a second inverter in the memory cell logic to the gated wordline driver upon the memory access of the valid bit memory cell.

15. A design structure embodied in a machine readable medium used in a design process, the design structure comprising:
a first design structure element representing a non-gated wordline driver that:
receives a memory access from a second design structure element representing an address decoder;
determines whether the memory access is a write access or a read access; and
responsive to determining the memory access as being the read access, outputs the data stored in a third design structure element representing a valid bit memory cell to a fourth design structure element representing a gated wordline driver; and the fourth design structure element representing the gated wordline driver:
determines whether the memory access is the write access or the read access;
responsive to the memory access as being the read access, determines whether the data from the valid bit memory cell from the non-gated wordline driver indicates either valid data or invalid data; and
responsive to the data being invalid, denies an output of the data in a fifth design structure element representing a row of memory cells associated with the fourth design structure element representing the gated wordline driver.

16. The design structure of claim 15, further comprising:
responsive to the data being valid, signaling, by the fourth design structure element representing the gated wordline driver, the fifth design structure element representing the row of memory cells associated with the fourth design structure element representing the gated wordline driver to output the data.

17. The design structure of claim 15, further comprising:
responsive to the first design structure element representing the non-gated wordline driver determining the memory access as being the write access:
writing the data associated with the write access to the third design structure element representing the valid bit memory cell; and
outputting the data stored in the third design structure element representing the valid bit memory cell to the fourth design structure element representing the gated wordline driver; and responsive to the fourth design structure element representing the gated wordline driver determining the memory access as being the write access:
writing the data associated with the write access to the fifth design structure element representing the row of memory cells.

18. The design structure of claim 15, wherein the first design structure element representing the non-gated wordline driver is one of a sixth design structure representing a plurality of non-gated wordline drivers, wherein the fourth design structure element representing the gated wordline driver is one of a seventh design structure element representing plurality of gated wordline drivers, and wherein the second design structure element representing the address decoder determines which non-gated wordline driver from the sixth design structure element representing the plurality of non-gated wordline drivers and which gated wordline driver from the seventh design structure element representing the plurality of gated wordline drivers to send the memory access to by:
  decoding, by the second design structure element representing the address decoder, an address associated with the memory access received from an eighth design structure element representing external logic.

19. The design structure of claim 15, wherein the second design structure element representing the non-gated wordline driver comprises:
  a first AND gate and a second AND gate, wherein the first AND gate has inputs of a read_enable signal and a write access complement signal, write_enable', and wherein the second AND gate has inputs of a read complement signal, read_enable', and a write_enable signal;
  an OR gate, wherein the OR gate receives an output from the first AND gate and an output from the second AND gate as inputs; and
  a third AND gate, that receives an output from the OR gate as a first input and an address_decode signal as a second input, wherein:
  responsive to receiving the write access:
    the read_enable signal is set low into the first AND gate, the read_enable' signal is set high into the second AND gate, the write_enable signal is set high into the second AND gate, and the write_enable' signal is set low into the first AND gate;
    responsive to the write_enable signal and the read_enable' signal both being high, the second AND gate outputs to the OR gate and the OR gate outputs to the third AND gate; and
    responsive to receiving the output from the OR gate and with the address_decode signal, the third AND gate outputs a write access signal to the third design structure element representing the valid bit memory cell;
  responsive to receiving the read access:
    the read_enable signal is set high into the first AND gate, the read_enable' signal is set low into the second AND gate, the write_enable signal is set low into the second AND gate, and the write_enable' signal is set high into first AND gate;
    responsive to the read_enable signal and the write_enable' signal both being high, the first AND gate outputs to the OR gate and the OR gate outputs to the third AND gate; and
    responsive to receiving the output from the OR gate and with the address_decode signal, the third AND gate outputs a read access signal to the third design structure element representing the valid bit memory cell.

20. The design structure of claim 15, wherein the fourth design structure element representing the gated wordline driver comprises:
  a first AND gate and a second AND gate, wherein the first AND gate has inputs of a read_enable signal, a write access complement signal, write_enable', and a valid bit signal and wherein the second AND gate has inputs of a read complement signal, read_enable', and a write_enable signal;
  an OR gate, wherein the OR gate receives an output from the first AND gate and an output from the second AND gate as inputs; and
  a third AND gate, that receives an output from the OR gate as a first input and an address_decode signal as a second input, wherein:
  responsive to receiving the write access:
    the read_enable signal is set low into the first AND gate, the read_enable' signal is set high into the second AND gate, the write_enable signal is set high into the second AND gate, and the write_enable' signal is set low into the first AND gate;
    responsive to the write_enable signal and the read_enable' signal both being high, the second AND gate outputs to the OR gate and the OR gate outputs to the third AND gate; and
    responsive to receiving the output from the OR gate and with the address_decode signal, the third AND gate outputs a write access signal to the third design structure element representing the valid bit memory cell;
  responsive to receiving the read access:
    the read_enable signal is set high into the first AND gate, the read_enable' signal is set low into the second AND gate, the write_enable signal is set low into the second AND gate, and the write_enable' signal is set high into first AND gate;
    responsive to the read_enable signal and the write_enable' signal both being high and the valid bit signal being high, the first AND gate outputs to the OR gate and the OR gate outputs to the third AND gate;
    responsive to receiving the output from the OR gate and with the address_decode signal, the third AND gate outputs a read access signal to the third design structure element representing the valid bit memory cell; and
    responsive to the read_enable signal and the write_enable' signal both being high and the valid bit signal being low, the first AND gate fails to output a signal to the OR gate thereby not allowing the read access to occur.

21. The design structure of claim 15, wherein the third design structure element representing the valid bit memory cell comprises:
  memory cell logic coupled to inverter logic, wherein the inverter logic outputs a value stored in a first inverter and a second inverter in the memory cell logic to the fourth design structure element representing the gated wordline driver upon the memory access of the third design structure element representing the valid bit memory cell.

22. The design structure of claim 15, wherein the design structure comprises a netlist.

23. The design structure of claim 15, wherein the design structure resides on storage medium as a data format used for the exchange of layout data of integrated circuits.

24. The design structure of claim 15, wherein the design structure includes at least one of test data, characterization data, verification data, or design specifications.

* * * * *